(12) United States Patent
Khandekar et al.

(10) Patent No.: US 6,639,820 B1
(45) Date of Patent: Oct. 28, 2003

(54) MEMORY BUFFER ARRANGEMENT

(75) Inventors: Narendra S. Khandekar, Folsom, CA (US); James M. Dodd, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/186,357

(22) Filed: Jun. 27, 2002

(51) Int. Cl.[7] .................................................. G11C 5/06
(52) U.S. Cl. ................. 365/63; 365/189.05; 365/230.08
(58) Field of Search ............................. 365/63, 189.05, 365/230.08

(56) References Cited

U.S. PATENT DOCUMENTS 6,317,352 B1 * 11/2001 Halbert et al. ................. 365/52
6,487,102 B1 * 11/2002 Halbert et al. ................. 365/51
6,493,250 B2   12/2002 Halbert et al.
6,542,393 B1 *  4/2003 Chu et al. ...................... 365/51

* cited by examiner

*Primary Examiner*—Richard Elms
*Assistant Examiner*—Tuan T. Nguyen
(74) *Attorney, Agent, or Firm*—Jeffrey B. Huter

(57) ABSTRACT

Memory modules, memory systems, and computing devices are described which include memory buffer devices that buffer signals of memory devices. In some embodiments, the memory buffer devices are positioned to reduce the circuit board footprint of the memory buffer devices.

27 Claims, 6 Drawing Sheets

MEMORY BUFFER ARRANGEMENT

BACKGROUND

Data transfer rates between memory and memory controllers are ever increasing. To improve signal integrity at higher transfer rates, memory buffer devices between the memory devices and memory controllers have been introduced. See, for example, U.S. Pat. No. 6,317,352 "Apparatus for Implementing a Buffered Daisy Chain Connection Between a Memory Controller and Memory Modules". The memory buffer devices reduce the number of devices connected to the memory bus, thus reducing the number of stubs on the memory bus which are a source of signal reflections. Further, memory buffer devices reduce the load on the memory controller by reducing the number of devices being directly driven by the memory controller. By reducing the load, the memory controller may utilize faster signal rates and/or lower signal voltages. The memory buffer devices, however, consume circuit board area. Reducing the circuit board footprint of the memory buffer devices may help satisfy the ever increasing desire for smaller form factors and increased storage capacity.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

The following description describes techniques for arranging buffer circuits of a memory system. In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

Figure 1:
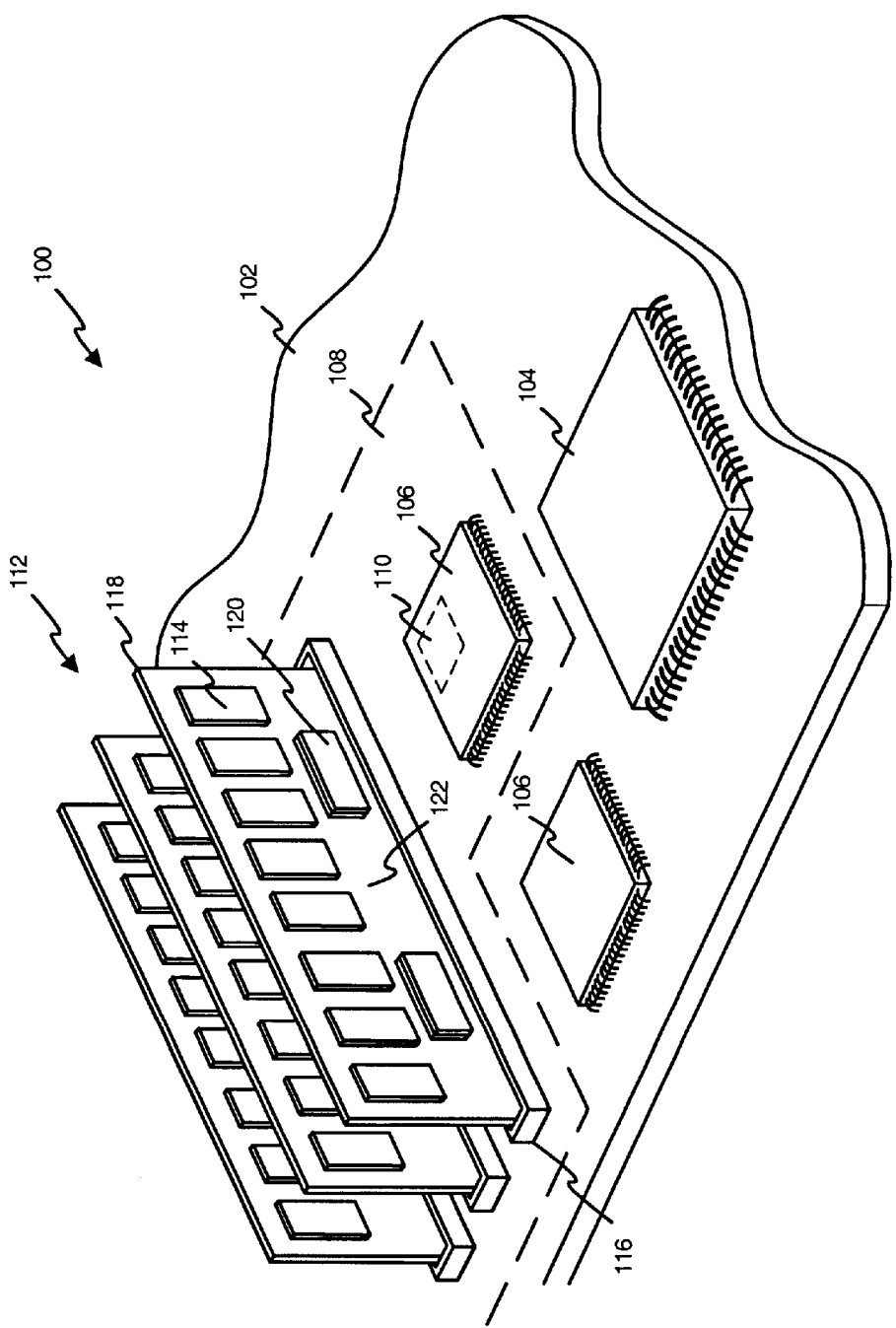
FIG. 1 illustrates an embodiment of a computing device.

An example embodiment of a computing device 100 is shown in FIG. 1. The computing device 100 may comprise a circuit board 102 such as, for example, a printed circuit board, mainboard, or motherboard. The circuit board 102, hereafter, is referred to as the motherboard 102 for convenience but is not limited to a motherboard implementation and may comprise one or more interconnected circuit boards. The computing device 100 may further comprise one or more processors 104, a chipset 106, and a memory system 108 that are interconnected via traces and/or other signal paths of the motherboard 102. The computing device 100 may further comprise other devices (not shown) such as, for example, a mouse, keyboard, video controller, hard disk, floppy disk, firmware, etc.

The chipset 106 may comprise one or more packaged integrated circuit devices that provide interfaces between the processor 104, the memory system 108, and the other devices of the computing device 100. In one embodiment, a single packaged integrated circuit device of the chipset 106, that may or may not include other functions of the chipset 106, contains a memory controller 110 of the memory system 108. The memory controller 110 in general provides the one or more processors 104 and/or other devices of the computing device 100 with access to memory 112 of the memory system 108. In another embodiment, the memory controller 110 is contained in the one or more processors 104 of the computing device 100. In yet other embodiments, portions of the memory controller 110 are distributed among the one or more processors 104 and/or one or more packaged integrated circuit devices of the chipset 106.

The memory 112 may comprise packaged memory devices 114 such as, for example, dynamic random access memory (DRAM) devices, synchronous direct random access memory (SDRAM) devices, double data rate (DDR) SDRAMs, quad data rate (QDR) SDRAM devices or other memory devices. The memory devices 114 may store data such as, for example, instructions and code that may be executed by the processors 104. In one embodiment, the memory system 108 comprises one or more module connectors 116 attached to the motherboard 102. Each module connector 116 is dimensioned to receive a memory module 118. Each memory module 118 may comprise a plurality of memory devices 114 and one or more stacked buffer devices 120 attached to a circuit board 122 having a plurality of signal connectors or leads 124 (See, FIG. 3). The plurality of leads 124 interface with signal connectors or leads (not shown) of the module connector 116 when the memory module 118 is inserted into the module connector 116.

While the computing device 100 is illustrated in FIG. 1 with three module connectors 116, other embodiments of the computing device 100 may comprise a different number of module connectors 116 to receive a different number of memory modules 118. Further, while the computing device 100 of FIG. 1 is illustrated with eight memory devices 114 and four buffer devices 120 per memory module 118, other embodiments of the computing device 100 may comprise a different number of memory devices 114 and/or a different number of buffer devices 120 per memory module 118.

Figure 2:
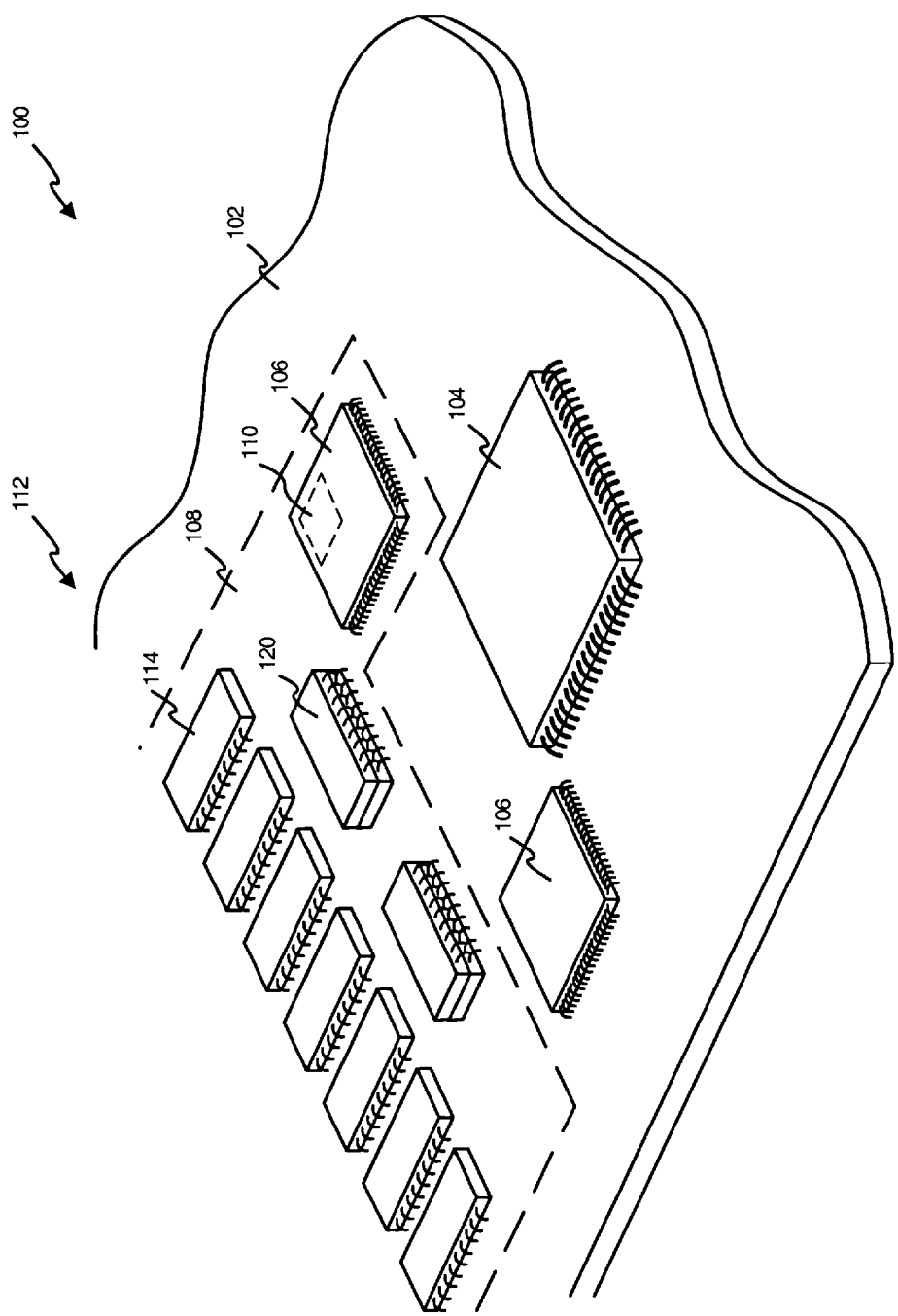
FIG. 2 illustrates another embodiment of a computing device.

In FIG. 2, another embodiment of the computing device 100 is shown. The memory system 108 of FIG. 2 may comprise packaged memory devices 114 and stacked buffer devices 120 that are attached to the motherboard 102 instead of a circuit board 122 of a memory module 118. In such an embodiment, the memory system 108 may be implemented without module connectors 116 to receive memory modules 118. However, it should be appreciated other embodiments of the computing device 100 may comprise both memory devices 114 attached to the motherboard 102 and module connectors 116 to receive memory modules 118.

Figure 3:
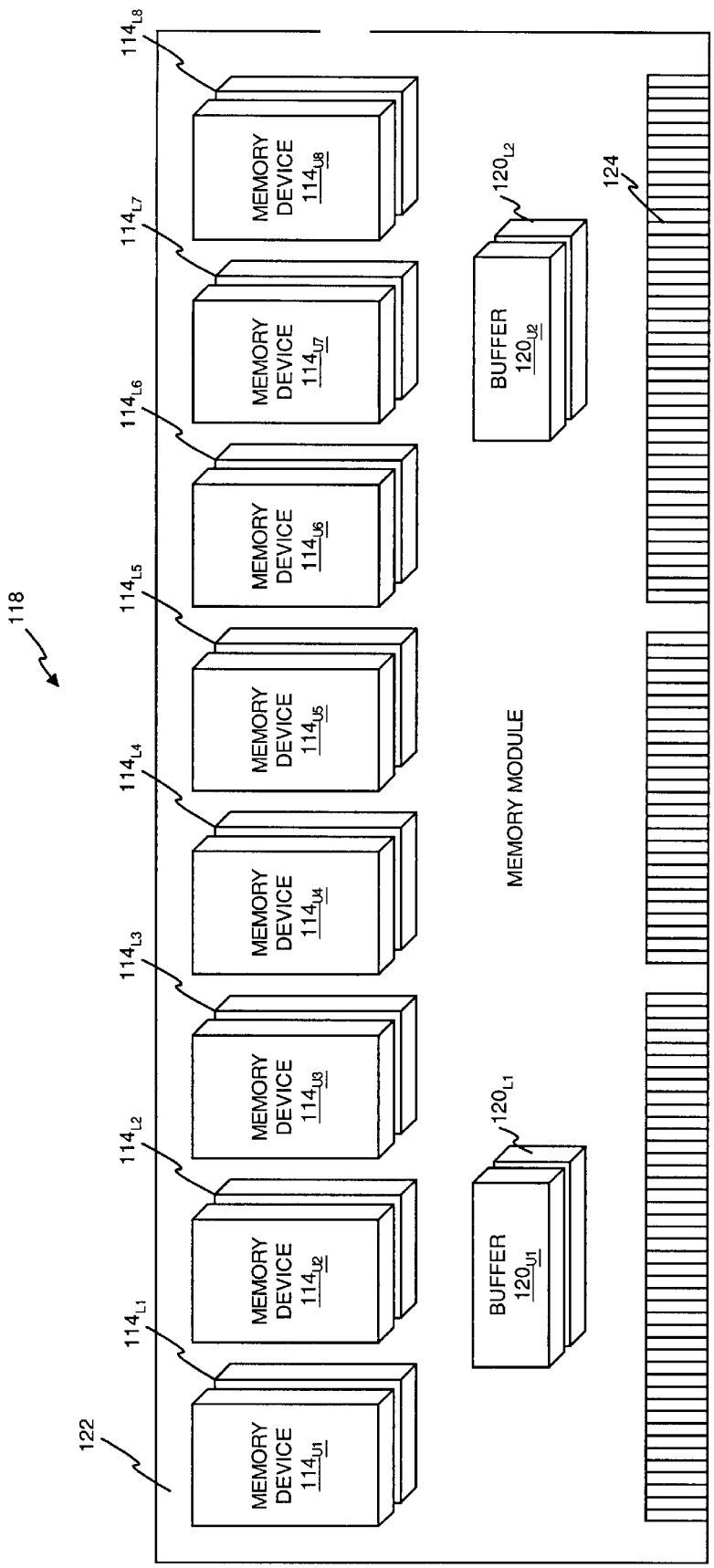
FIG. 3 illustrates an embodiment of stacked buffer devices that may be used in the computing devices of FIG. 1 and FIG. 2.

Referring now to FIG. 3, an embodiment of a memory module 118 is shown. The memory module 118 may comprise memory devices $114_{U1-U8}$, $114_{L1-L8}$ and buffer devices $120_{U1-U2}$, $120_{L1-L2}$ attached to a circuit board 122 having leads 124. As indicated previously, the memory devices $114_{U1-U8}$, $114_{L1-L8}$ may comprise packaged memory devices such as, for example, DRAM devices, SDRAM devices, DDR SDRAM devices, QDR SDRAM devices or other memory devices. In one embodiment, the memory module 118 may comprise data buffer devices $120_{L1-L2}$ and address/command buffer devices $120_{U1-U2}$ that are stacked upon the data buffer devices $120_{L1-L2}$.

In general, the data buffer devices $120_{L1-L2}$ buffer read and/or write data signals between the memory controller 110 and the memory devices $114_{U1-U8}$, $114_{L1-L8}$. The data buffer devices $120_{L1-L2}$ may receive write data signals from the memory controller 110 via a memory bus 126 (See, FIGS. 4 and 5) and may provide the memory devices $114_{U1-U8}$, $114_{L1-L8}$ with write data signals that are based upon the received write data signals. It should be appreciated that the data buffer devices $120_{L1-L2}$ may provide the memory devices $114_{U1-U8}$, $114_{L1-L8}$ with write data signals that are in a different form than the write data signals received from the memory controller 110. For example, the memory controller 110 may generate low voltage differential data signals upon the memory bus 126 and the data buffer device $120_{L1-L2}$ may provide the memory devices $114_{U1-U8}$, $114_{L1-L8}$ with high voltage non-differential data signals. Further, in a daisy-chain environment, the data buffer devices $120_{L1-L2}$ may further provide data buffer devices $120_{L1-L2}$ of another memory module 118 with write data signals that are based upon the write data signals received from the memory controller 110 and/or data buffer devices $120_{L1-L2}$ of another memory module 118.

The data buffer devices $120_{L1-L2}$ may receive read data signals from the memory device $114_{U1-U8}$, $114_{L1-L8}$ and may provide the memory controller 110 with read data signals that are based upon the received read data signals. Again, it should be appreciated that the data buffer devices $100_{L1-L2}$ may provide the memory controller 110 with read data signals that are in a different form than the read data signals received from the memory devices $114_{U1-U8}$, $114_{L1-L8}$. Further, in a daisy-chain environment, the data buffer devices $120_{L1-L2}$ may further provide data buffer devices $120_{L1-L2}$ of another memory module 118 with read data signals that are based upon the read data signals received from the memory devices $114_{U1-U8}$, $114_{L1-L8}$ and/or data buffer devices $120_{L1-L2}$ of another memory module 118.

In general, the address/command buffer devices $120_{U1-U2}$ buffer address/command signals between the memory devices $114_{U1-U8}$, $114_{L1-L8}$ and the memory controller 110. The address/command buffer devices $120_{U1-U2}$ may receive address/command signals from the memory controller 110 via the address/command lines of the memory bus 126 and may provide the memory devices $114_{U1-U8}$, $114_{L1-L8}$ with address/command signals that are based upon the received address/command signals. It should be appreciated that the address/command buffer $120_{U1-U2}$ may provide the memory devices $114_{U1-U8}$, $114_{L1-L8}$ with address/command signals that may be in a different form than the address/command signals received from the memory controller 110. Further, in a daisy-chain environment, the address/command buffer devices $120_{U1-U2}$ may further provide address/command buffer devices $120_{U1-U2}$ of another memory module 118 with address/command signals that are based upon the address/command signals received from the memory controller 110 and/or data buffer devices $120_{L1-L2}$ of another memory module 118.

While the memory module 118 of FIG. 3 was described as having address/command buffer devices $120_{U1-U2}$ stacked upon data buffer devices $120_{L1-L2}$, the data buffer devices $120_{L1-L2}$ may be stacked upon the address/command buffer devices $120_{U1-U2}$ in other embodiments. Further, while the embodiment of FIG. 3 was described with a certain allocation of data, address, and command signal buffering, other allocations are also possible. For example, memory modules 118 may comprise separate address buffer devices 120 to buffer address signals, separate command buffer devices 120 to buffer command signals, separate data buffer devices 120 to buffer data signals, separate read data buffer devices 120 to buffer read data signals, and/or separate write data buffer devices 120 to buffer write data signals which may be stacked in different combinations. Further, memory modules 118 may comprise buffer devices 120 that buffer different combinations of signals such as data/address buffer devices 120 to buffer data and address signals, data/command buffer devices 120 to buffer data and command signals, write data/address buffer devices 120 to buffer write data and address signals, read data/address buffer devices 120 to buffer read data and address signals, etc.

Figure 4:
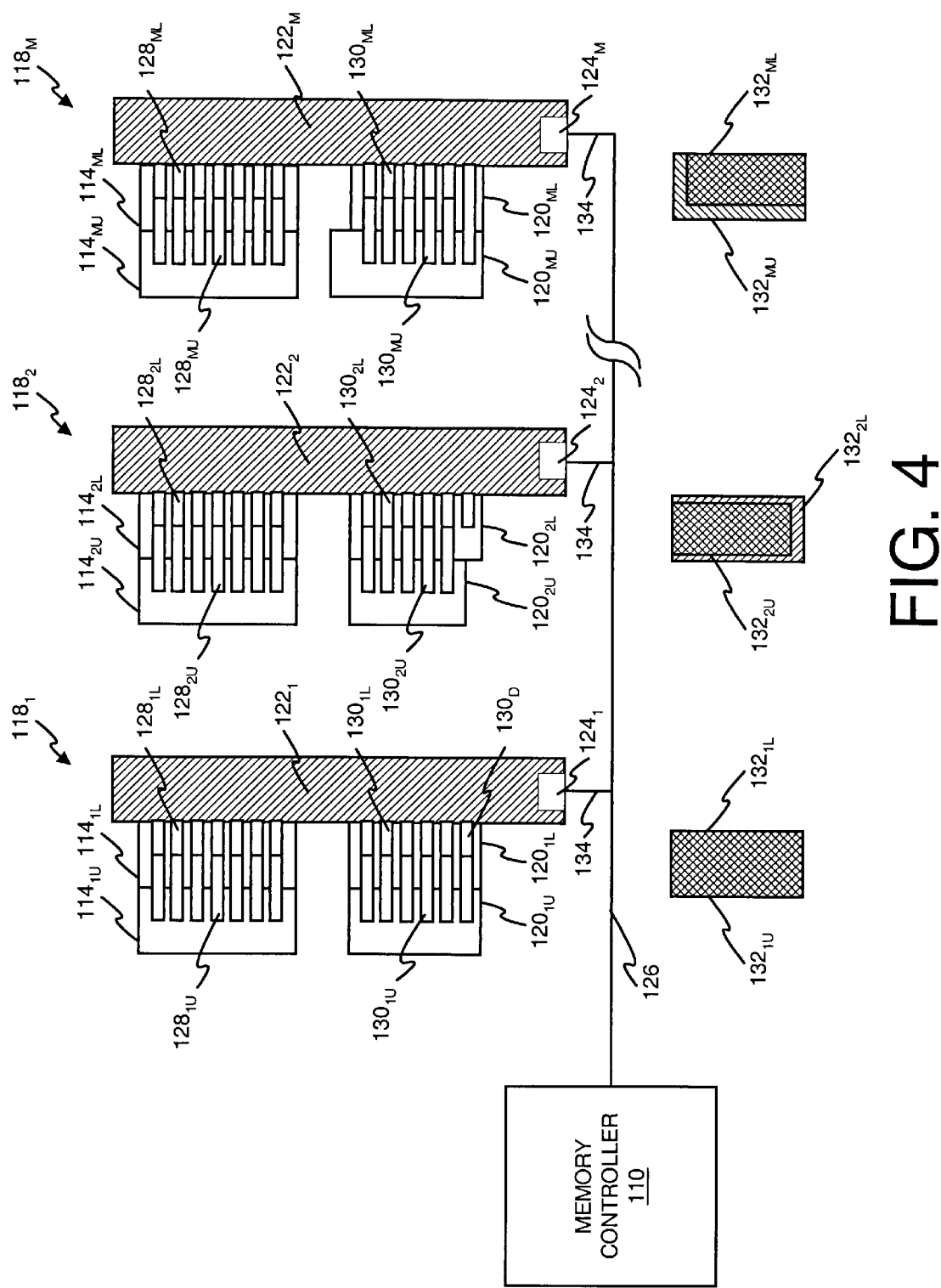
FIG. 4 illustrates an example multi-drop connection between a memory controller and buffer devices that may be employed in the computing devices of FIG. 1 and FIG. 2.

Referring now to FIG. 4, the memory devices $114_{1U-MU}$, $114_{1L-ML}$ may comprise signal connectors or leads $128_{1U-MU}$, $114_{1L-ML}$ to interface or couple integrated circuits of the memory devices $114_{1U-MU}$, $114_{1L-ML}$ with the buffer devices $120_{1U-MU}$, $120_{1L-ML}$. Further, the memory devices $114_{1U-MU}$ may be stacked or positioned on other memory devices $114_{1L-ML}$ to reduce the circuit board area used by the memory devices $114_{1U-MU}$, $114_{1L-ML}$. For example, the memory module 118, may comprise an upper memory device $114_{1U}$ that may be position over a lower memory device $114_{1L}$ with its leads, $128_{1U}$ coupled to the leads $128_{1L}$ of the lower memory device $114_{1L}$.

Similarly, the buffer devices $120_{1U-MU}$, $120_{1L-ML}$ may comprise signal connectors or leads $130_{1U-MU}$, $130_{1L-ML}$ to interface or couple integrated circuits of the buffer devices $120_{1U\text{-}MU}$, $120_{1L\text{-}ML}$ with the leads 124 of the memory module $118_{1\text{-}M}$. The buffer device $120_{1U\text{-}MU}$, $120_{1L\text{-}ML}$ may be stacked or otherwise positioned such that a lower buffer device $120_{1L\text{-}ML}$ lies between the circuit board 122 and an upper buffer device $120_{1U\text{-}MU}$. In one embodiment, the leads $130_{1U}$ of an upper buffer devices $120_{1U}$ may be coupled to leads $130_{1L}$ of a lower buffer device $120_{1L}$ and/or to traces (not shown) of the circuit board 122. In another embodiment, an upper buffer device $120_{MU}$ may comprise more leads $130_{MU}$ than a lower buffer device $120_{ML}$. In a further embodiment, an upper buffer device $120_{2U}$ may comprise fewer leads $130_{2U}$ than a lower buffer device $120_{2L}$. In yet another embodiment, a lower buffer device $120_{1L}$ may comprise additional or dummy leads $130_D$ that do not provide a signal path to the integrated circuit of the lower buffer device $120_{1L}$. Instead of providing a signal path for integrated circuits of the lower buffer devices $120_{1L}$, the dummy lead $130_D$ of the lower buffer device $120_{1L}$ provides a location to which leads $130_{1U}$ of the upper buffer device $120_{1U}$ may be coupled in order to send and/or receive signals to and/or from the circuit board 122.

Further, a lower buffer device $120_{1L}$ and a upper buffer device $120_{1U}$ may have substantially the same circuit board geometry. The upper buffer device $120_{1U}$ may be positioned or stacked upon the lower buffer device $120_{1L}$ such that the circuit board footprint or projected circuit board area $132_{1U}$ of the upper buffer device $120_{1U}$ and the circuit board footprint or projected circuit board area $132_{1L}$ of the lower buffer device $120_{1L}$ are substantially coincidental. In another embodiment, the lower buffer device $120_{2L}$ may be larger than the upper buffer device $120_{2U}$. The upper buffer device $120_{2U}$ may be positioned or stacked upon the lower buffer device $120_{2L}$ such that the circuit board footprint or projected circuit board area $132_{2U}$ of the upper buffer device $120_{2U}$ is substantially encompassed within the circuit board footprint or projected circuit board area $132_{2L}$ of the lower buffer device $120_{2L}$. In yet another embodiment, the lower buffer device $120_{ML}$ may be smaller than the upper buffer device $120_{MU}$. The upper buffer device $120_{MU}$ may be positioned or stacked upon the lower buffer device $120_{ML}$ such that the circuit board footprint or projected circuit board area $132_{ML}$ of the lower buffer device $120_{ML}$ is substantially encompassed within the circuit board footprint or projected circuit board area $132_{MU}$ of the upper buffer device $120_{MU}$.

The memory modules 118 may be coupled to the memory controller 110 via a memory bus 126 in a multi-drop fashion. The memory bus 126 may comprise data lines and non-data lines such as, for example, address lines, command lines, and clock lines to transfer data signals, address signals, command signals, and clock signals. In one embodiment, the buffer devices 120 isolate the memory devices 114 of the memory modules 118 from the memory bus 126 and the memory controller 110. As a result, the buffer devices 120 may reduce the load experienced by the memory controller 110 by reducing the number of components driven by the memory controller 110. Further, the buffer devices 120 may reduce the number of stubs 134 coupled to the memory bus 126 since each memory device 114 is not separately coupled to memory bus 126 via a separate stub 134. By reducing the number of stubs 134 and/or the number of devices, the buffer devices 120 may help increase the signal integrity and/or transfer rate of the memory bus 126.

Figure 5:
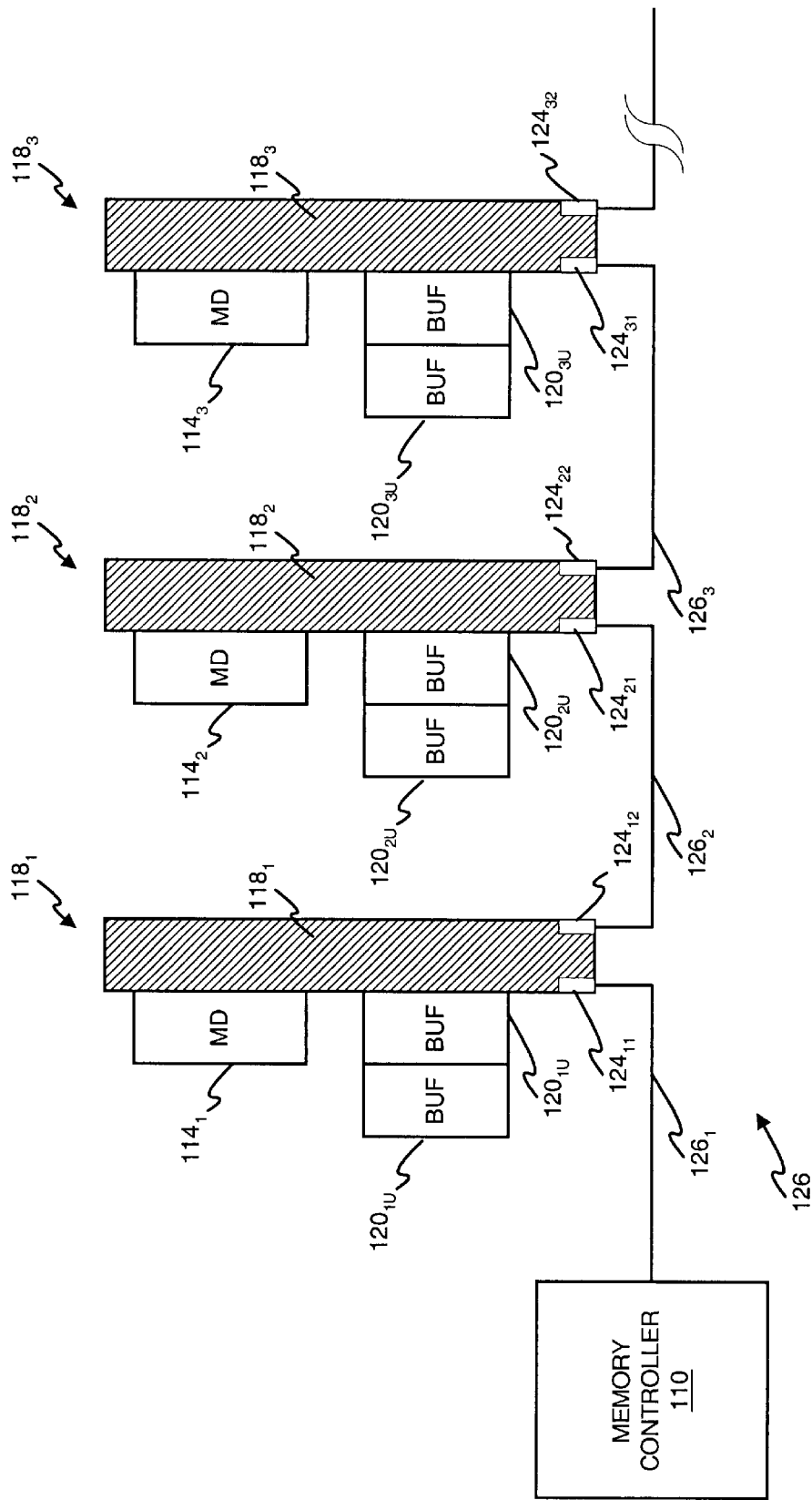
FIG. 5 illustrates an example daisy-chain connection between a memory controller and buffer devices that may be employed in the computing devices of FIG. 1 and FIG. 2.

The memory modules $118_{1\text{-}3}$ in another embodiment may be coupled to the memory controller 110 via a memory bus 126 in a daisy-chain fashion as shown in FIG. 5. A memory bus segment $126_1$ may couple the memory controller 110 to the buffer devices $120_{1U}$, $120_{1L}$ via leads $124_{11}$ of a memory module $118_1$. A memory bus segment $126_2$ may further couple the buffer devices $120_{1U}$, $120_{1L}$ of the memory module $118_1$ to the buffer devices $120_{2U}$, $120_{2L}$ of a memory module $118_2$ by coupling leads $124_{12}$ of the memory module $118_1$ to leads $124_{21}$ of the memory module $118_2$. A memory bus segment $126_3$ may further couple the buffer devices $120_{2U}$, $120_{2L}$ of the memory module $118_2$ to buffer devices $120_{3U}$, $120_{3L}$ of a memory module $118_3$ by coupling leads $124_{22}$ of the memory module $118_2$ to leads $124_{31}$ of the memory module $118_3$, and so on. The daisy-chain coupling of the memory modules $118_1$, $118_2$, $118_3$ to the memory controller 110 may further reduce the load driven by the memory controller 110 and/or the number of stubs 134 present on the memory bus 126.

Figure 6:
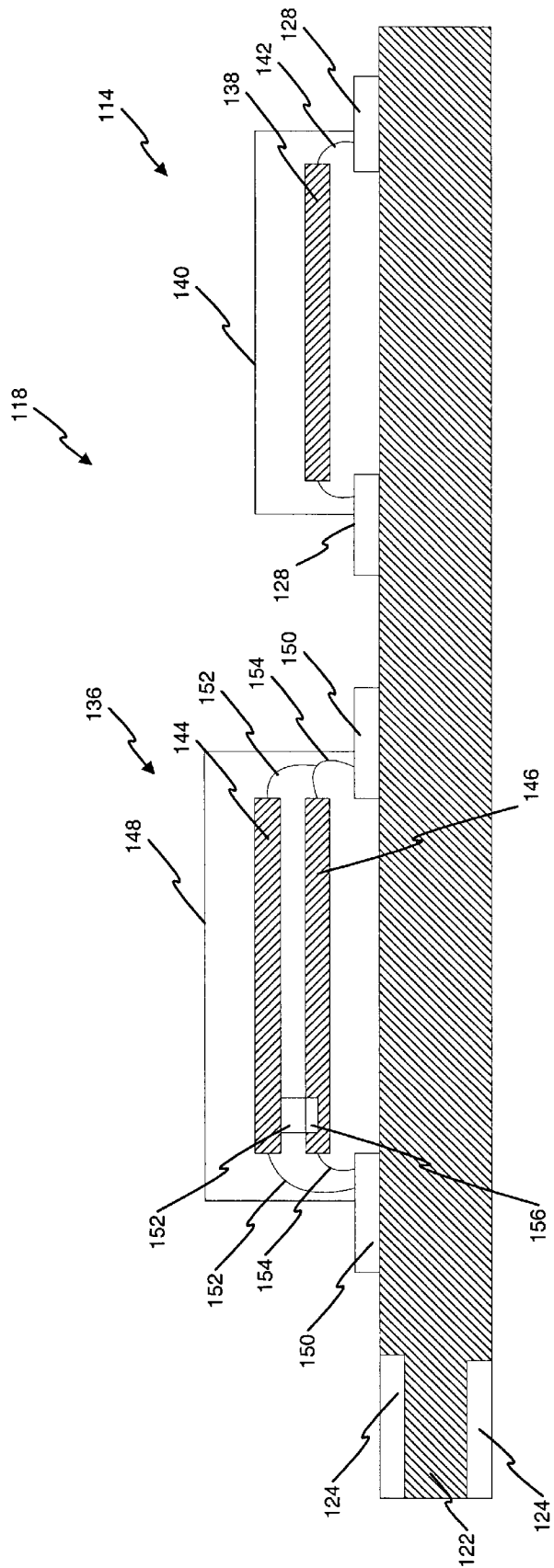
FIG. 6 illustrates an embodiment of stacked integrated buffer circuits that may be used in the computing devices of FIG. 1 and FIG. 2.

Referring now to FIG. 6, yet another embodiment of a memory module 118 is shown. The memory module 118 may comprise one or more memory devices 114 and one or more buffer devices 136 attached to a circuit board 122 having leads 124. The memory device 114 may comprise a die or substrate 138 having an integrated memory circuit in a packaging device 140 having leads 128. Bonding wires or other intra-package connectors 142 couple the integrated memory circuit to the leads 128 of the packing device 140.

Similarly, the buffer device 136 may comprise a die or substrate 144 that is stacked upon or positioned above a die or substrate 146. The die 144 may comprise a integrated buffer circuit such as, for example, a data buffer circuit and the die 146 may comprise a integrated buffer circuit such as, for example, an address/command buffer circuit. The buffer device 136 may further comprise a packaging device 148 to house or otherwise package the integrated buffer circuits. The packaging device 148 may comprise package leads or other signal connectors 150 that provide a signal path from the circuit board 122 to the integrated buffer circuits.

Bonding wires or other intra-package connectors 152 couple the integrated buffer circuit to the package leads 150. Similarly, bonding wires or other intra-package connectors 154 couple the integrated buffer circuit to the package leads 150. In one embodiment, the connectors 152 directly couple the integrated buffer circuit to the package leads 150. In another embodiment, the connectors 152 couple the integrated buffer circuit to the package leads 150 via the connectors 154 of the integrated buffer circuit and/or connection points 156 of the integrated buffer circuit. It should be appreciated that other packaging technologies such as ball-grid arrays may also be used to package the integrated buffer circuits of the buffer device 136.

While certain features of the invention have been described with reference to example embodiments, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. A memory module comprising
   a circuit board comprising at least one lead,
   a plurality of first memory devices attached to the circuit board,
   a first buffer device attached to the circuit board and coupled between the at least one lead and the plurality of first memory devices to buffer signaling therebetween, and a second buffer device stacked upon the first buffer device and coupled between the at least one lead and the plurality of first memory devices to buffer signaling therebetween.

2. The memory module of claim 1, further comprising a plurality of second memory devices stacked on the first memory devices.

3. The memory module of claim 1, wherein
the first buffer device is to apply data signals to the plurality of first memory devices that are dependent upon data signals received from the at least one lead, and
the second buffer device is to apply address signals to the plurality of first memory devices that are dependent upon address signals received from the at least one lead.

4. The memory module of claim 1, wherein
the first buffer device comprises data buffers to apply data signals to the at least one lead that are dependent upon data signals received from the plurality of first memory devices, and
the second buffer device comprises address buffers to apply address signals to the plurality of first memory devices that are dependent upon address signals received from the at least one lead.

5. The memory module of claim 4, wherein the second buffer further comprises a controller to apply control signals to the plurality of first memory devices that are dependent upon command signals from the at least one lead.

6. The memory module of claim 1, wherein
the first buffer device is to apply address signals to the plurality of first memory devices that are dependent upon address signals received from the at least one lead, and
the second buffer device is to apply data signals to the plurality of first memory devices that are dependent upon data signals received from the at least one lead.

7. The memory module of claim 2 wherein the first buffer device is coupled between the at least one lead and the plurality of second memory devices to buffer signaling therebetween.

8. For use with a memory controller, a memory module comprising
a circuit board,
a plurality of memory devices coupled to the circuit board to store data,
a first integrated circuit coupled to the circuit board to buffer signals between the memory controller and the plurality of memory devices, and
a second integrated circuit to buffer signals between the memory controller and the plurality of memory devices, wherein
at least a portion of the first integrated circuit lies between the second integrated circuit and the circuit board.

9. The memory module of claim 8, wherein
a single packaged device comprises both the first integrated circuit and the second integrated circuit.

10. The memory module of claim 8, wherein
a first packaged device comprises the first integrated circuit, and
a second packaged device comprises the second Integrated circuit.

11. The memory module of claim 10, wherein
the first packaged device comprises a plurality of first leads coupled to the circuit board, and the second packaged device comprises a plurality of second leads coupled to the plurality of first leads.

12. The memory module of claim 8, wherein
the first integrated circuit is to apply data signals to the plurality of memory devices that are dependent upon data signals received from the memory controller, and
the second integrated circuit is to apply address signals to the plurality of memory devices that are dependent upon address signals received from the memory controller.

13. The memory module of claim 8, wherein
the first integrated circuit comprises data buffers to apply data signals to the memory controller that are dependent upon data signals received from the plurality of memory devices, and
the second integrated circuit comprises address buffers to apply address signals to the plurality of memory devices that are dependent upon address signals received from the memory controller.

14. The memory module of claim 13, wherein the second integrated circuit further comprises a controller to apply control signals to the plurality of memory devices that are dependent upon command signals received from the memory controller.

15. The memory module of claim 8, wherein
the first integrated circuit is to apply address signals to the plurality of memory devices that are dependent upon address signals received from the memory controller, and
the second integrated circuit is to apply data signals to the plurality of memory devices that are dependent upon data signals received from the memory controller.

16. A memory subsystem, comprising
a plurality of memory devices to store data,
a memory controller to generate memory address signals in response to requests to read data from the plurality of memory devices,
a first buffer device coupled between the memory controller and the plurality of memory devices to send data signals to the memory controller based upon data retrieved from the plurality of memory devices, and
a second buffer device positioned over the first buffer device and coupled between the memory controller and the plurality of memory devices to address the plurality of memory devices based upon the memory address signals.

17. The memory subsystem of claim 16, further comprising a third buffer device coupled between the memory controller and the plurality of memory devices to send data signals to the memory controller based upon data retrieved from the plurality of memory devices, and
a fourth buffer device positioned over the third buffer device and coupled between the memory controller and the plurality of memory devices to address the plurality of memory devices based upon the memory address signals.

18. The memory subsystem of claim 16, further comprising
a third buffer device coupled between the memory controller and the plurality of memory devices to send data signals lo the memory controller based upon data retrieved from the plurality of memory devices, and
a fourth buffer device positioned over the third buffer device and coupled between the memory controller and the plurality of memory devices to control the plurality of memory devices based upon memory command signals, the memory controller to generate the memory command signals in response to requests to read data from the plurality of memory devices.

19. The memory subsystem of claim 16, wherein the memory controller is to generate memory command signals in response to requests to read data from the plurality of memory devices, and the second buffer device is to control the plurality of memory devices based upon the memory command signals received from the memory controller.

20. The memory subsystem of claim 16, wherein the first buffer device comprises first leads that are coupled to the memory controller to receive the memory data signals and the memory address signals, and the second buffer device comprises second leads that are coupled to the first leads to receive the memory address signals.

21. The memory subsystem of claim 20, wherein the first leads outnumber the second leads, and the second leads are coupled to a subset of the first leads.

22. A computing device, comprising a plurality of volatile memory devices to store data, a processor to generate requests to read data from the plurality of volatile memory devices, a memory controller to receive the requests of the processor and to generate address signals In response to the requests, a first buffer device comprising first leads coupled to the memory controller to receive the address signals of the memory controller and second leads coupled to the memory controller to provide the memory controller with data signals representative of data stored by a volatile memory device of the plurality of volatile memory devices, and a second buffer device comprising first leads coupled to the first leads of the first buffer device to receive the address signals from the memory controller via the first leads of the first buffer device and to respectively apply address signals to the volatile memory device of the plurality of volatile memory devices.

23. The computing device of claim 22, wherein the plurality of volatile memory devices comprises double data rate random access memory devices.

24. The computing device of claim 22, wherein the memory controller is to further generate command signals in response to the requests generated by the processor, the first buffer device further comprises third leads coupled to the memory controller to receive the command signals of the memory controller, and the second buffer device further comprising second leads coupled to the third leads of the first buffer device.

25. The computing device of claim 24, wherein the second leads of the second buffer device comprise at least one of the first leads of the second buffer device.

26. The computing device of claim 24, wherein the third leads of the first buffer device comprise at least one of the first leads of the first buffer device.

27. The computing device of claim 24, wherein the third leads of the first buffer device comprise at least a subset of the first leads of the first buffer device and at least one of the second leads of the first buffer device.

* * * * *